(12) United States Patent
Takahashi et al.

(10) Patent No.: US 7,920,840 B2
(45) Date of Patent: Apr. 5, 2011

(54) WIRELESS RECEIVER APPARATUS PROVIDED WITH GAIN CONTROL AMPLIFIER

(75) Inventors: Kouji Takahashi, Osaka (JP); Kosuke Ota, Tokyo (JP)

(73) Assignee: Panasonic Corporation, Osaka (JP)

( * ) Notice: Subject to any disclaimer, the term of this patent is extended or adjusted under 35 U.S.C. 154(b) by 859 days.

(21) Appl. No.: 11/905,063

(22) Filed: Sep. 27, 2007

(65) Prior Publication Data
US 2008/0076373 A1 Mar. 27, 2008

(30) Foreign Application Priority Data

Sep. 27, 2006 (JP) ................... 2006-262421

(51) Int. Cl.
*H04B 7/00* (2006.01)
*H04B 1/06* (2006.01)

(52) U.S. Cl. ............... 455/232.1; 455/234.1; 455/241.1; 455/250.1; 330/278

(58) Field of Classification Search ............... 455/232.1, 455/234.1, 241.1, 250.1, 245.1, 245.2, 246.1, 455/247.1, 234.2, 240.1, 249.1, 127.2, 127.3, 455/253.1, 254, 138–139, 341; 330/278, 330/98, 254, 310, 282–284; 327/560, 52–54; 375/317–319, 345
See application file for complete search history.

(56) References Cited

U.S. PATENT DOCUMENTS

| 6,205,189 | B1* | 3/2001 | Ha | 375/345 |
| 6,621,345 | B2 | 9/2003 | Matsugatani et al. | |
| 6,798,286 | B2* | 9/2004 | Dauphinee et al. | 330/129 |
| 6,823,025 | B2* | 11/2004 | Lee et al. | 375/320 |
| 7,005,922 | B2* | 2/2006 | Oshima et al. | 330/278 |
| 7,046,078 | B2* | 5/2006 | Nguyen et al. | 327/541 |
| 7,076,223 | B2 | 7/2006 | Matsugatani et al. | |
| 7,495,513 | B2* | 2/2009 | Dally et al. | 330/279 |

FOREIGN PATENT DOCUMENTS

| JP | 2001-292189 | 10/2001 |
| JP | 2002-290177 | 10/2002 |
| JP | 2004-23708 | 1/2004 |

* cited by examiner

*Primary Examiner* — Pablo N Tran
(74) *Attorney, Agent, or Firm* — Wenderoth, Lind & Ponack, L.L.P.

(57) ABSTRACT

In a wireless receiver apparatus including a gain control amplifier for controlling a gain of a reception signal, a maintaining device compulsorily maintains the gain of the gain control amplifier at a predetermined fixed value only in a predetermined specified interval. The maintaining device includes a latch circuit for maintaining a gain set value immediately prior to the specified interval. A start timing of the specified interval is determined by an edge of a predetermined timer start signal, and a duration of the specified interval is determined on the basis of a count of a predetermined timer clock signal and a count of a predetermined timer count set bus signal.

14 Claims, 10 Drawing Sheets

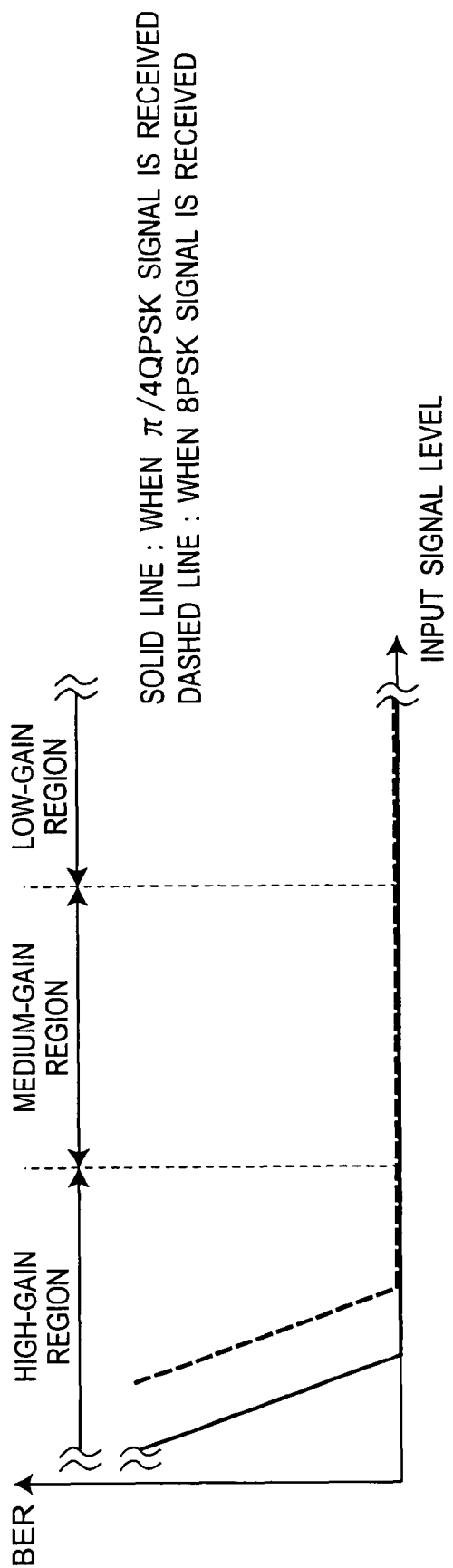

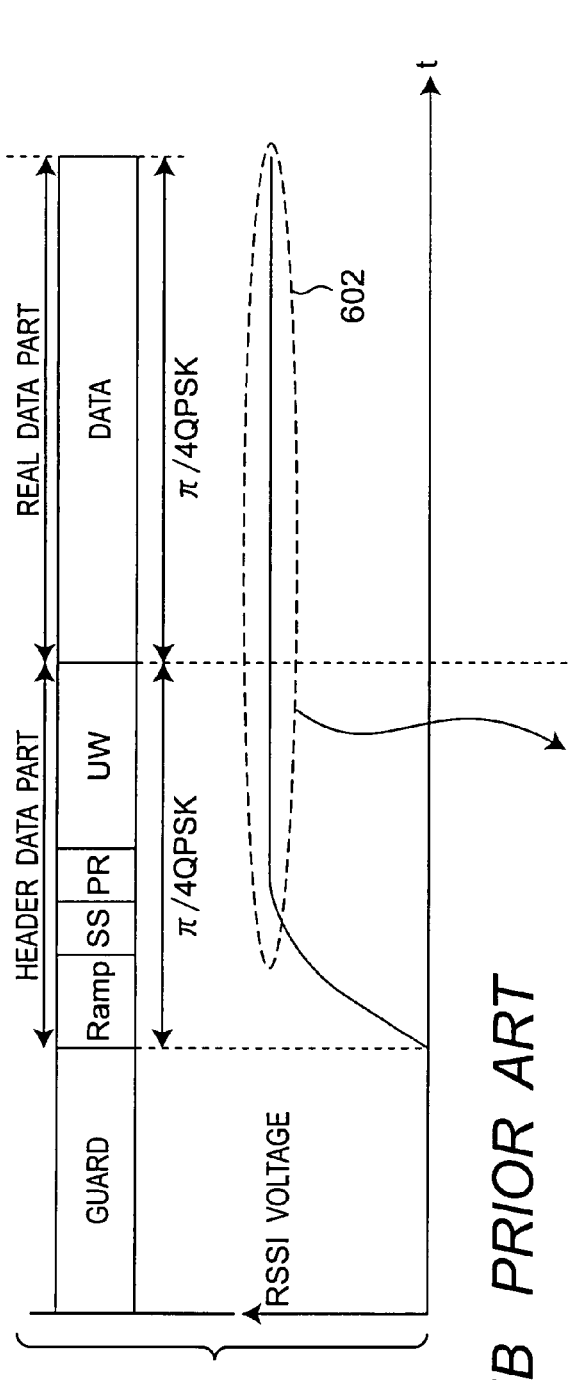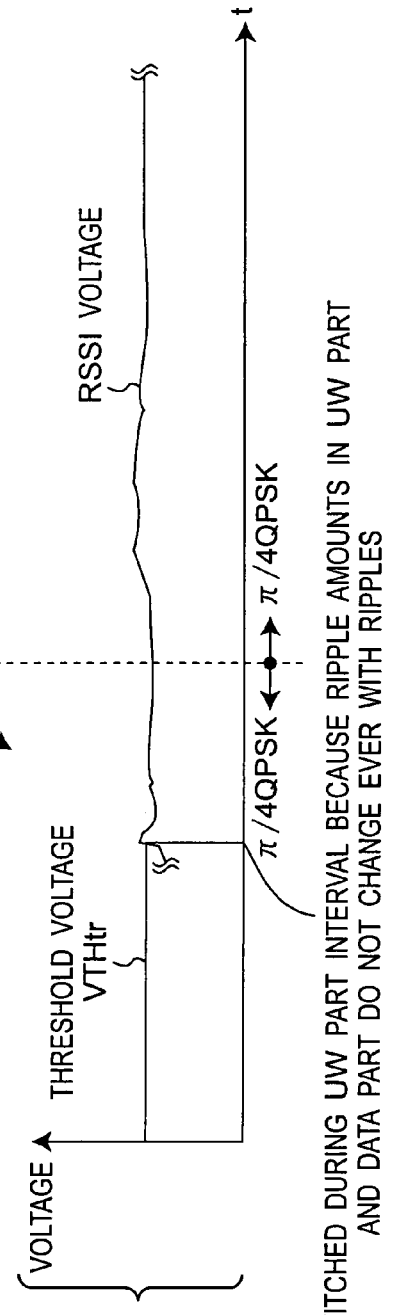
Fig.7A PRIOR ART
Fig.7B PRIOR ART

WIRELESS RECEIVER APPARATUS PROVIDED WITH GAIN CONTROL AMPLIFIER

BACKGROUND OF THE INVENTION

1. Field of the Invention

The present invention relates to a wireless receiver apparatus, and in particular, to a wireless receiver apparatus including a gain control amplifier (GCA), and a semiconductor integrated circuit which is formed by integrating a circuit of the wireless receiver apparatus.

2. Description of the Related Art

FIG. 9 is a block diagram showing a configuration of a wireless receiver apparatus used in, for example, a wireless communication system of a personal handy-phone system (hereinafter referred to as PHS) according to a prior art, and FIG. 10 is a block diagram showing a configuration of a frequency converter and intermediate frequency circuit 3A of FIG. 9.

Referring to FIG. 9, the wireless receiver apparatus of the prior art is configured by including an antenna 1, a high frequency amplifier circuit 2, the frequency converter and intermediate frequency circuit 3A and a demodulator 4. A wireless signal received by the antenna 1 is low-noise-amplified by the high frequency amplifier circuit 2, and then, it is inputted to the frequency converter and intermediate frequency circuit 3A. An alternative configuration may be provided, in which the output signal from the high frequency amplifier circuit 2 is low-noise-amplified and then it is outputted to the frequency converter and intermediate frequency circuit. The frequency converter and intermediate frequency circuit 3A performs intermediate frequency amplification having a low frequency conversion function to process the inputted wireless signal into a predetermined intermediate frequency signal and an automatic gain control (hereinafter referred to as AGC) function, and then, outputs the processed intermediate frequency signal to the demodulator 4. The demodulator 4 demodulates the inputted intermediate frequency signal into an audio signal and a baseband signal of data and so on by a predetermined demodulation system, and then, outputs the resulting signals.

Referring to FIG. 10, the frequency converter and intermediate frequency circuit 3A is configured by including an input terminal 100, a mixer 101, a band-pass filter (BPF) 102, a gain control amplifier (GCA) 103, a band-pass filter (BPF) 104, an output terminal 105, a PLL (Phase Locked Loop) circuit 200, a three-line bus 201 for channel setting, a shift register and latch circuit 202, an RSSI (Received Signal Strength Identifier) detector circuit 300, a hold capacitor 301 for holding an RSSI detection voltage, a voltage follower circuit 302 for impedance conversion, comparators 303 and 303A, threshold voltage sources 303a and 303b, an AGC selection circuit 304 including switches 304a and 304b and an AGC control logic circuit 311.

FIG. 4 is a graph showing an input signal level to bit error rate (BER) characteristic in the frequency converter and intermediate frequency circuit 3A of FIG. 10 of the prior art. It is noted that the gain of the AGC control logic circuit 311 is switched at the boundaries of adjoining regions of a high-gain region, a medium-gain region and a low-gain region in the AGC control logic circuit 311 of FIG. 10.

FIG. 6A is a timing chart showing a response characteristic of the RSSI voltage with respect to reception data when an 8PSK wireless signal having a field strength in the vicinity of a threshold voltage VTHtr of the comparator 303 in the frequency converter and intermediate frequency circuit 3A of FIG. 10, and FIG. 6B is an enlarged timing chart of a portion 601 of FIG. 6A. In this case, the 8PSK wireless signal means a wireless signal modulated by 8-phase PSK. FIG. 7A is a timing chart showing a response characteristic of the RSSI voltage with respect to reception data when a π/4QPSK wireless signal having a field strength in the vicinity of the threshold voltage VTHtr of the comparator 303 in the frequency converter and intermediate frequency circuit 3A of FIG. 10, and FIG. 7B is an enlarged timing chart of a portion 602 of FIG. 7A. In this case, the π/4QPSK wireless signal means a wireless signal modulated by QPSK with a shift of π/4.

Referring to FIG. 6, it has been confirmed that, when the gain of the gain control amplifier 103 is switched by the operation of the AGC control logic circuit 311 of FIG. 10 not for the interval of a start symbol (SS), a preamble (PR) and a unique word (UW) of the header data part but for the interval of the actually received data part of the data signal demodulated from the received wireless signal, partial data of the actually received data part at the time of switching drops out and a bit error rate (BER) deteriorates (See 501 and 502 of FIG. 4). As a countermeasure, the above phenomenon has been conquered by switching the gain of the gain control amplifier 103 for the interval of the unique word (UW) of the header data part by changing the constant of the hold capacitor 301 for holding the RSSI detection voltage to change the time constant. That is, as shown in FIG. 7, the amounts 6f ripples in the unique word (UW) and the data scarcely vary even with ripples in the RSSI voltage, the gain of the gain control amplifier 103 can be switched for the interval of the unique word (UW) of the header data part.

Moreover, the Japanese patent laid-open publication No. JP 2004-23708-A discloses a wireless terminal apparatus for suppressing an offset voltage that rapidly varies in accordance with a gain control signal in a direct conversion receiver and the wireless terminal apparatus that includes the receiver. In the wireless terminal apparatus, a dummy offset generator circuit generates a dummy offset voltage in accordance with the voltage detected from an output node of a variable gain amplifier and the gain control signal, and a dummy variable gain amplifier generate an offset cancellation voltage by amplifying the dummy offset voltage in accordance with the gain control signal, and outputs the offset cancellation voltage to the output node of the variable gain amplifier, and this leads to cancellation of the offset voltage component from the output signal of the variable gain amplifier.

However, there has recently been a mode in which the modulation systems of the header data part and the real data part change with the advance of data transfer. For example, in an upgradable system of a PHS wireless system, the header data part is modulated by π/4QPSK modulation, and the real data part is modulated by 8PSK modulations. In such a mode, the amount of ripples in a field strength detection current outputted from the RSSI detector circuit 300 differs in the header data part and the real data part. Even when the constant of the hold capacitor 301 of the prior art is optimized, the gain of the gain control amplifier is disadvantageously varied for the interval of the real data part at an input level in the vicinity of the field strength with which the gain of the gain control amplifier 103 varies, and the bit error rate (BER) deteriorates as shown in FIG. 4, and this leads to deterioration in the conversation quality. It is noted that the problem could not be solved also in the wireless terminal apparatus disclosed in the Japanese patent lad-open publication No. JP 2004-23708-A.

SUMMARY OF THE INVENTION

An object of the present invention is to solve the above-mentioned problems and provide a wireless receiver apparatus capable of keeping a good conversation quality by preventing the deterioration in the signal quality at the time of switching the gain of the gain control amplifier, and to provide a semiconductor integrated circuit which is formed by integrating a circuit of the wireless receiver apparatus.

According to one aspect of the present invention, there is provided a wireless receiver apparatus including a gain control amplifier for controlling a gain of a reception signal. The wireless receiver apparatus includes a maintaining device for compulsorily maintaining the gain of the gain control amplifier at a predetermined fixed value only in a predetermined specified interval.

In the above-mentioned wireless receiver apparatus, the maintaining device includes a latch circuit for maintaining a gain set value immediately prior to the specified interval.

In the above-mentioned wireless receiver apparatus, a start timing of the specified interval is determined by an edge of a predetermined timer start signal, and a duration of the specified interval is determined on the basis of a count of a predetermined timer clock signal and a count of a predetermined timer count set bus signal.

In the above-mentioned wireless receiver apparatus, an end timing of the specified interval is determined on the basis of an edge of a predetermined timer reset signal.

The above-mentioned wireless receiver apparatus preferably further includes a setting device for setting whether or not to operate the maintaining device on the basis of a predetermined AGC timer busy/non-busy signal.

In the above-mentioned wireless receiver apparatus, the AGC timer busy/non-busy signal is transmitted on a predetermined three-line bus for setting a predetermined reception channel.

The above-mentioned wireless receiver apparatus preferably further includes a first selection circuit for selecting one first control signal from a plurality of predetermined first control signals, and outputting a selected signal as a timer start signal.

The above-mentioned wireless receiver apparatus preferably further includes a second selection circuit for selecting one second control signal from a plurality of predetermined second control signals, and outputting a selected signal as a timer reset signal.

The above-mentioned wireless receiver apparatus preferably further includes a frequency divider circuit for dividing a frequency of a predetermined reference clock signal by an inputted frequency division number, and outputs a frequency-divided signal as a timer clock signal.

The above-mentioned wireless receiver apparatus preferably further includes a third selection circuit for selecting one signal from a serial timer count set bus signal transmitted on a three-line bus for setting a predetermined reception channel and an external timer count set bus signal, and outputting a selected signal as a timer count set bus signal.

The above-mentioned wireless receiver apparatus preferably further includes a further setting device for setting timer counts of the serial timer count set bus signal and the external timer count set bus signal to arbitrary timer counts, respectively.

The above-mentioned wireless receiver apparatus preferably further includes a fourth selection circuit for selecting one signal from a serial timer clock set bus signal transmitted on a three-line bus for setting a predetermined reception channel and an external timer clock set bus signal, and outputting a selected signal as a signal representing the frequency division number.

In the above-mentioned wireless receiver apparatus, a start timing of the specified interval is set for an interval for which a unique word (UW) of a received wireless signal is received.

In the above-mentioned wireless receiver apparatus, an end timing of the specified interval is set after transfer of reception data in one slot of a received wireless signal is completed.

According to another aspect of the present invention, there is provided a semiconductor integrated circuit which is formed by integrating a circuit of the wireless receiver apparatus.

Accordingly, the start timing of the specified interval is preferably set for the interval during which the unique word (UW) of the received wireless signal is received, and the end timing of the specified interval is preferably set after the transfer of the reception data in one slot of the received wireless signal is completed. Therefore, the phase change of the reception signal due to the gain switching of the real data part of the received wireless signal as shown in FIG. 5 disappears, and this leads to keeping the satisfactory communication quality without any deterioration point of the bit error rate (BER).

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 5 is a graph showing an input signal level to bit error rate (BER) characteristic in the frequency converter and intermediate frequency circuit 3 of FIG. 2;

FIG. 7A is a timing chart showing a response characteristic of the RSSI voltage with respect to reception data when a π/4QPSK wireless signal having a field strength in the vicinity of the threshold voltage VTHtr of the comparator 303 in the frequency converter and intermediate frequency circuit 3A of FIG. 10;

FIG. 7B is an enlarged timing chart of a portion 602 of FIG. 7A;

DETAILED DESCRIPTION OF THE PREFERRED EMBODIMENTS

Figure 1:
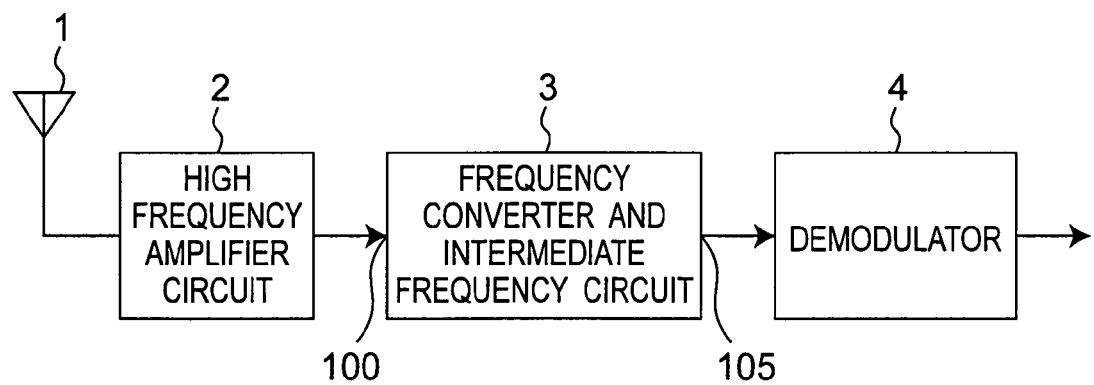
FIG. 1 is a block diagram showing a configuration of a wireless receiver apparatus according to an embodiment of the present invention.

Embodiments of the present invention will be described with reference to the drawings. In each of the following embodiments, similar components are denoted by like reference numerals.

Figure 2:
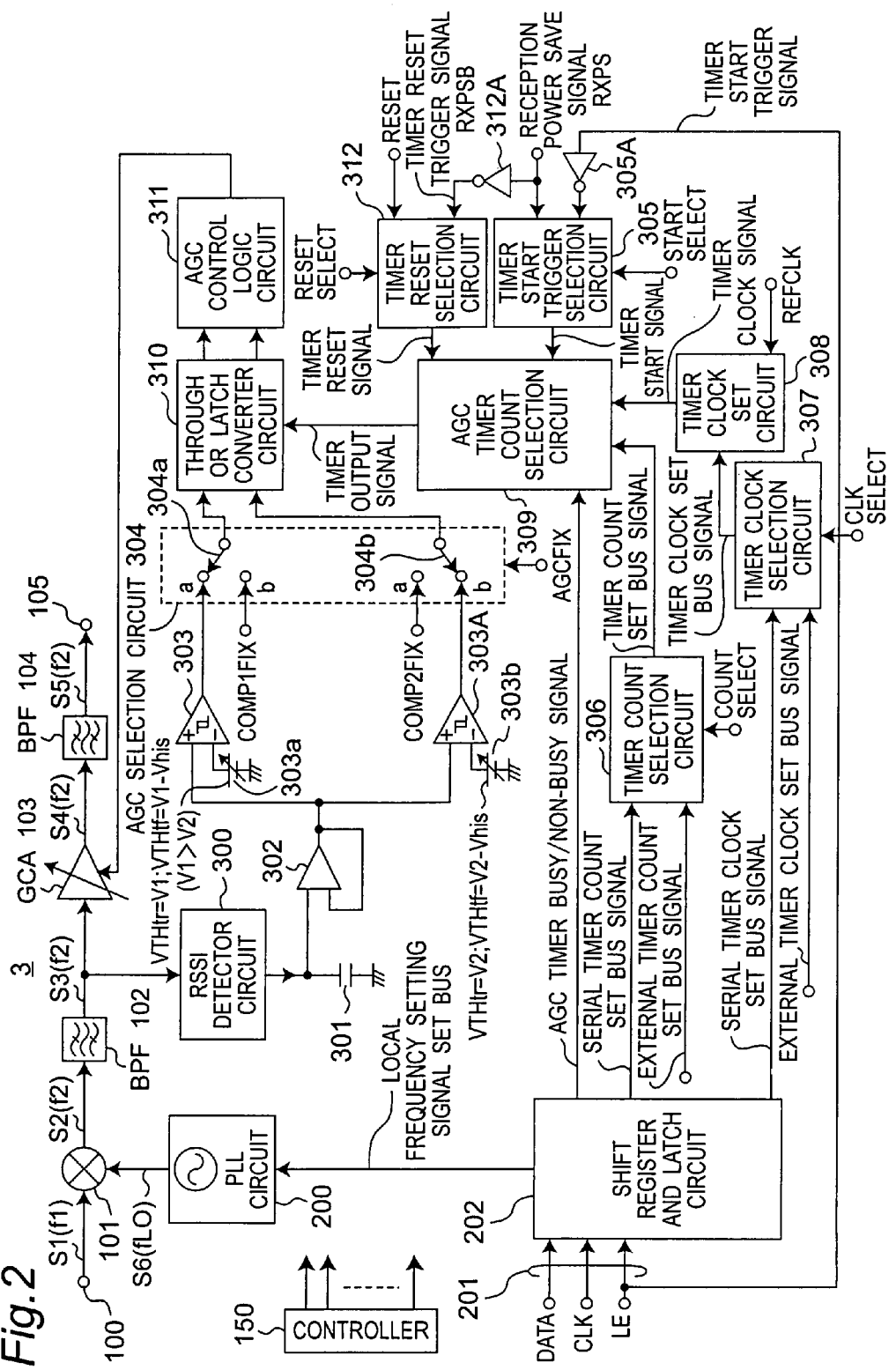
FIG. 2 is a block diagram showing a configuration of a frequency converter and intermediate frequency circuit 3 of FIG. 1.
Figure 9:
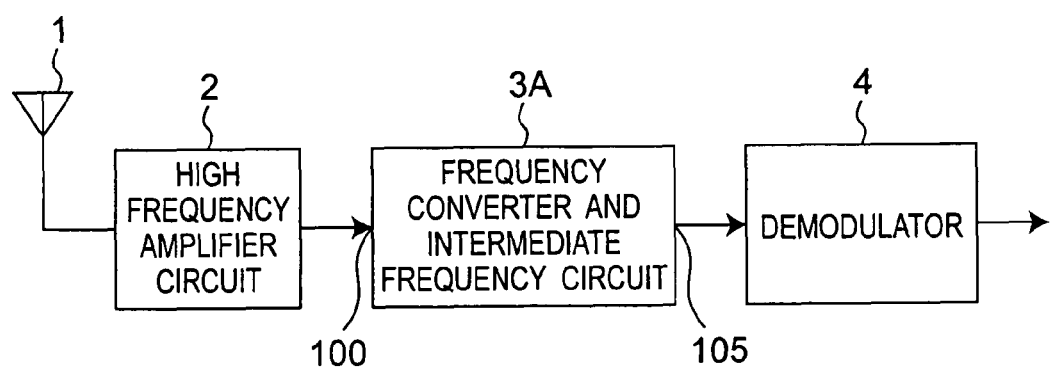
FIG. 9 is a block diagram showing a configuration of a wireless receiver apparatus of a prior art.
Figure 10:
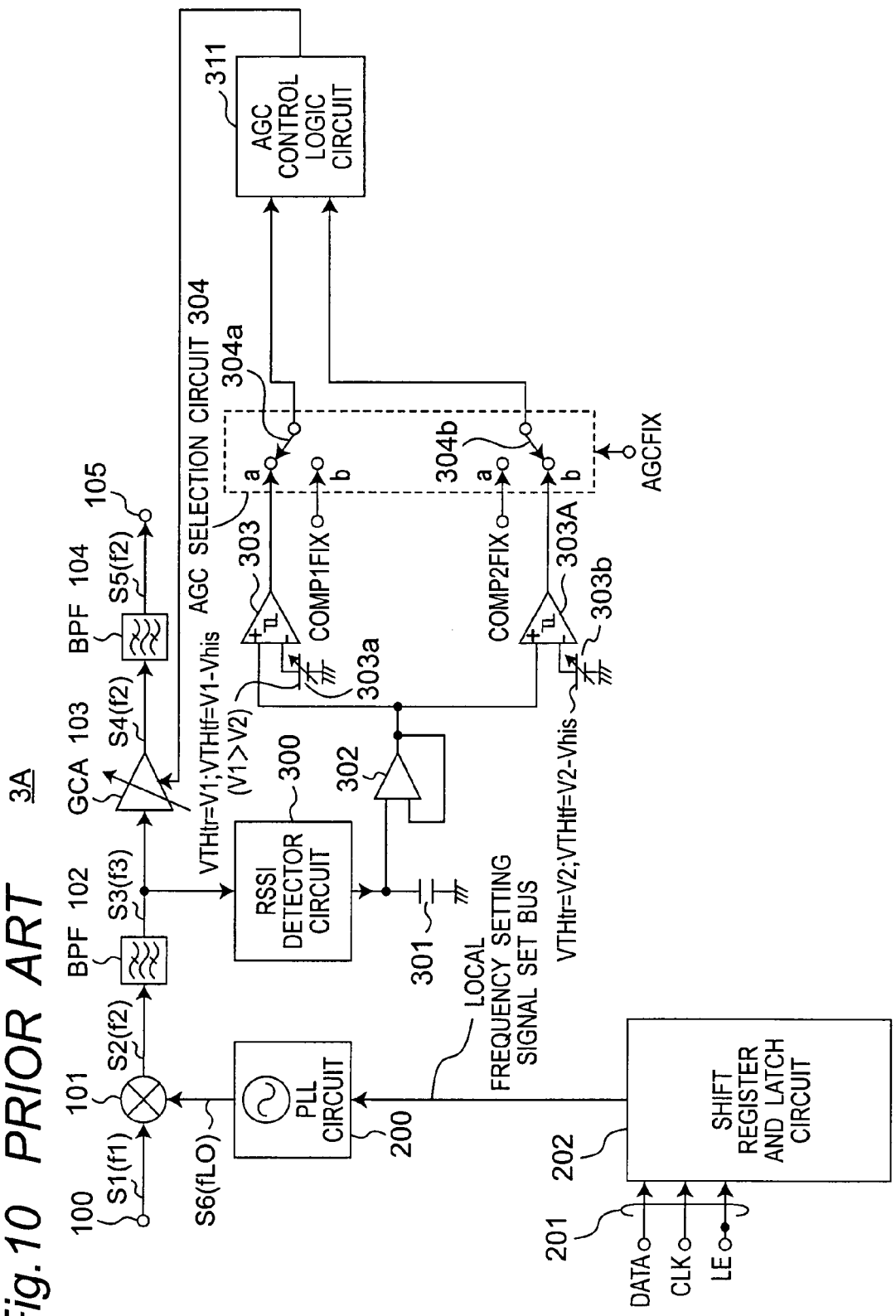
FIG. 10 is a block diagram showing a configuration of a frequency converter and intermediate frequency circuit 3A of FIG. 9.

FIG. 1 is a block diagram showing a configuration of a wireless receiver apparatus according to an embodiment of the present invention, and FIG. 2 is a block diagram showing a configuration of the frequency converter and intermediate frequency circuit 3 of FIG. 1. As shown in FIG. 1, the wireless receiver apparatus of the present embodiment is configured by including an antenna 1, a high frequency amplifier circuit 2, the frequency converter and intermediate frequency circuit 3, and a demodulator 4. A wireless signal received by the antenna 1 is low-noise-amplified by the high frequency amplifier circuit 2, and then, it is inputted to the frequency converter and intermediate frequency circuit 3. It is herein noted that an alternative configuration may be used, in which the output signal from the high frequency amplifier circuit 2 is low-noise-amplified and then it is outputted to the frequency converter and intermediate frequency circuit. The frequency converter and intermediate frequency circuit 3 performs intermediate frequency amplification having a low frequency conversion function to process the inputted wireless signal into a predetermined intermediate frequency signal and an AGC function, and outputs the processed intermediate frequency signal to the demodulator 4. The demodulator 4 demodulates the inputted intermediate frequency signal into an audio signal and a baseband signal of the data and so on by a predetermined demodulation system, and outputs a resulting signal. That is, the wireless receiver apparatus of the present embodiment is characterized by including the frequency converter and intermediate frequency circuit 3 in place of the frequency converter and intermediate frequency circuit 3A as compared with the wireless receiver apparatus of the prior art of FIG. 9.

Referring to FIG. 2, the frequency converter and intermediate frequency circuit 3 is characterized by further including a through or latch converter circuit 310 and its control signal generator circuits (including a timer start trigger selection circuit 305, a timer count selection circuit 306, a timer clock selection circuit 307, a timer clock set circuit 308, an AGC timer count selection circuit 309, a timer reset selection circuit 312, and two inverters 305A and 312A) in addition to an input terminal 100, a mixer 101, a band-pass filter (BPF) 102, a gain control amplifier (GCA) 103, a band-pass filter (BPF) 104, an output terminal 105, a PLL (Phase Locked Loop) circuit 200, a three-line bus 201 for channel setting, a shift register and latch circuit 202, an RSSI (Received Signal Strength Identifier) detector circuit 300, a hold capacitor 301 for holding an RSSI detection voltage, a voltage follower circuit 302 for impedance conversion, comparators 303 and 303A, threshold voltage sources 303a and 303b, an AGC selection circuit 304 having switches 304a and 304b, and an AGC control logic circuit 311.

The wireless receiver apparatus of the present embodiment is characterized in that the phase change of the reception wireless signal due to the gain change is eliminated and the deterioration in the communication quality is prevented by fixing the gain of the gain control amplifier 103 in a specified interval while receiving the wireless signal in the wireless receiver apparatus having the gain control amplifier (GCA) 103. In concrete, timer counting is started with a load enable signal LE of the serial three-line bus 201 for setting the reception channel capable of grasping a time relation with the reception slot and the leading edge of a reception power save signal RXPS from the controller 150 of the wireless receiver apparatus, and after the gain of the gain control amplifier 103 is set compulsorily fixed for the interval of the unit word (UW) part in the reception slot, the fixation of the gain is released after the last bit of the real data part by utilizing the edge of a reset signal from the controller 150.

Referring to FIG. 2, a wireless signal S1($f1$) having a radio frequency f1 inputted via the input terminal 100 is inputted to the mixer 101, and the mixer 101 generates an intermediate frequency signal having a frequency f1±fLO by mixing the inputted wireless signal S1($f1$) with a local oscillation signal S6(fLO) from the PLL circuit 200, and then, outputs the resulting signal to the band-pass filter (BPF) 102. The band-pass filter (BPF) 102 removes signal components at the frequency f1+fLO and in adjacent predetermined bandwidth and subjects the signal components having a frequency f2=f1−fLO and having adjacent predetermined bandwidth to band-pass filtering, and then, outputs an intermediate frequency signal S3($f2$) having a frequency f2 obtained through the band-pass filtering to the control amplifier 102 and the RSSI detector circuit 300. The gain control amplifier 103 amplifies the inputted intermediate frequency signal S3($f2$) by a gain indicated by the AGC control logic circuit 311, and then, outputs a resulting signal via the band-pass filter (BPF) 104 that subjects the intermediate frequency signal having signal components at the frequency f2 and in adjacent predetermined bandwidth in order to suppress the interference frequency components outside the bandwidth and the output terminal 105.

Figure 3:
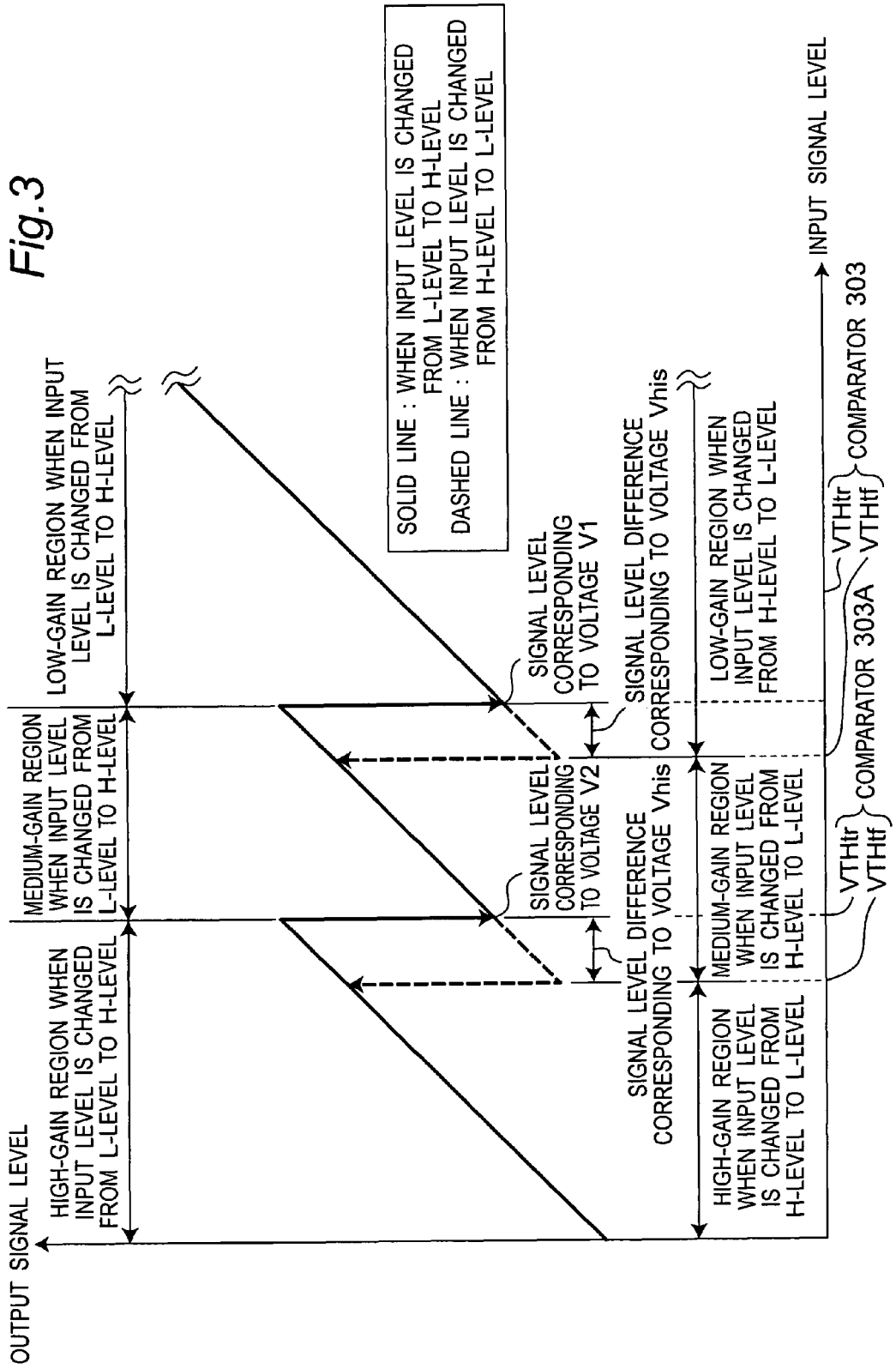
FIG. 3 is a graph showing a characteristic of the output signal level with respect to the input signal level in the gain control amplifier 103 concerning the gain control operation of the frequency converter and intermediate frequency circuit 3 of FIG. 2.
Figure 4:
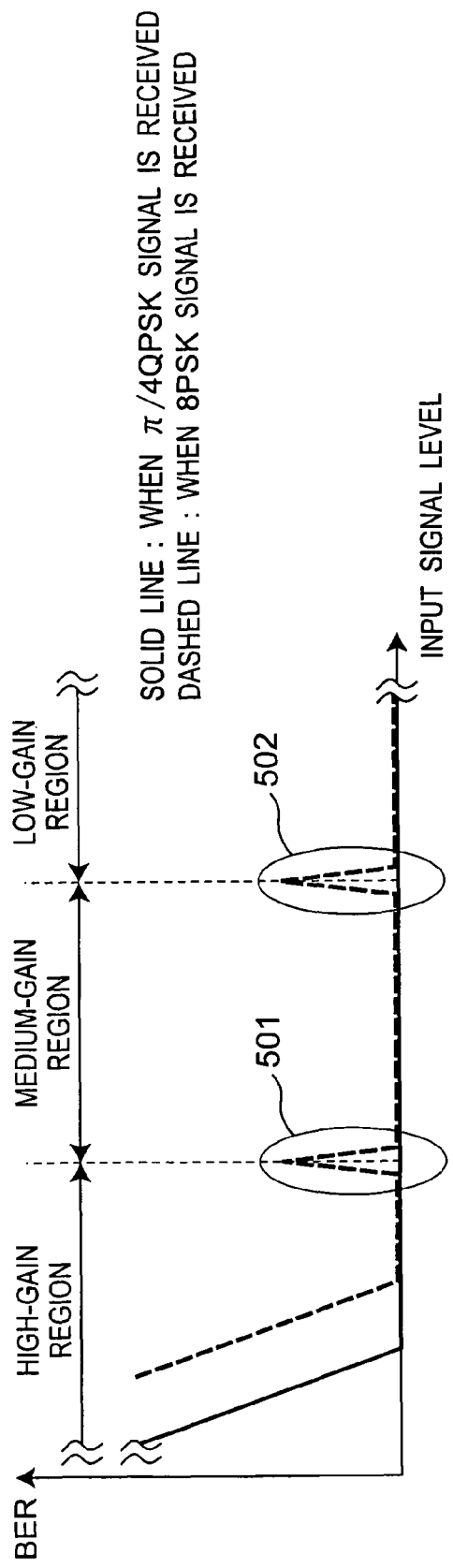
FIG. 4 is a graph showing an input signal level to bit error rate (BER) characteristic in a frequency converter and intermediate frequency circuit 3A of FIG. 10 of the prior art.
Figures 6A, 6B:
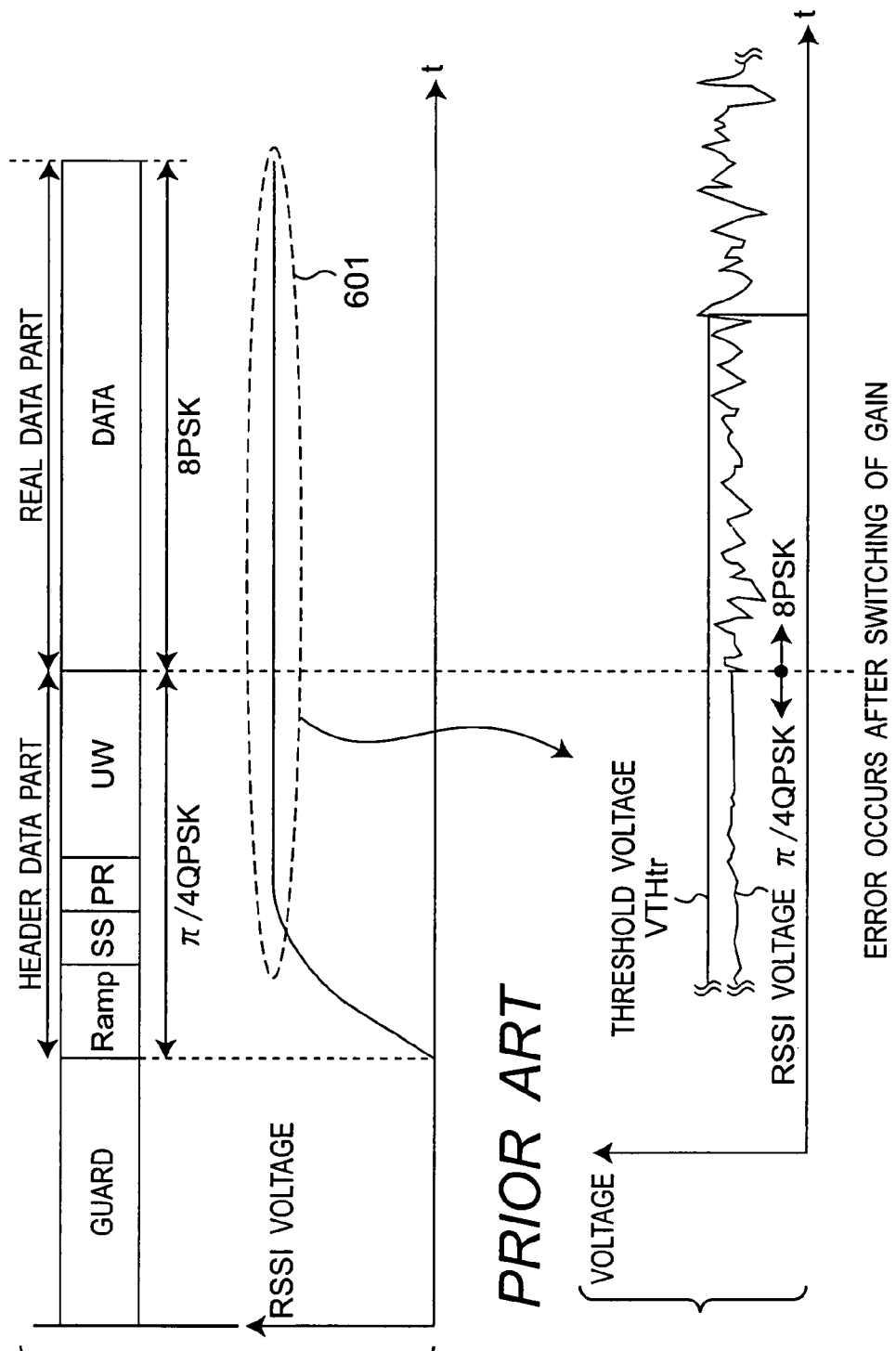
FIG. 6A is a timing chart showing a response characteristic of the RSSI voltage with respect to reception data when an 8PSK wireless signal having a field strength in the vicinity of a threshold voltage VTHtr of the comparator 303 in the frequency converter and intermediate frequency circuit 3A of FIG. 10.
FIG. 6B is an enlarged timing chart of a portion 601 of FIG. 6A.

FIG. 3 is a graph showing a characteristic of the output signal level with respect to the input signal level in the gain control amplifier 103 concerning the gain control operation of the frequency converter and intermediate frequency circuit 3 of FIG. 2. Next, the operation when the gain control amplifier 103 is in a variable gain state will be described below with reference to FIG. 3.

Referring to FIG. 2, the RSSI detector circuit 300 generates an output current corresponding to the field strength of the wireless signal received by the antenna 1 on the basis of the inputted intermediate frequency signal S3($f2$), and then, outputs a resulting current to the hold capacitor 301. The hold capacitor 301 subjects the output current to current-to-voltage conversion into an RSSI voltage (field strength detection voltage) corresponding to the current, and then, outputs a resulting voltage to non-inverted input terminals of the comparators 303 and 303A via the voltage follower circuit 302 that performs impedance conversion. On the other hand, the voltage source 303a generates predetermined threshold voltages VTHtr and VTHtf, and then, outputs the voltages to the inverted input terminal of the comparator 303, and the voltage source 30b generates predetermined threshold voltages VTHtr and VTHtf, and then, outputs the voltages to the inverted input terminal of the comparator 303A. In this case, when the input impedance of the comparators 303 and 303A is sufficient high, the voltage follower circuit 302 may be removed. The comparator 303 compares the voltage inputted to the non-inverted input terminal with the threshold voltage applied to the inverted input terminal, generates a gain setting signal for the gain control amplifier 103 having a difference voltage of the comparison result, and outputs the same signal to the through or latch converter circuit 310 via a contact "a" of the switch 304a of the AGC selection circuit 304. Moreover, the comparator 303A compares the voltage inputted to the non-inverted input terminal with the threshold voltage applied to the inverted input terminal, generates a gain setting signal for the gain control amplifier 103 having a difference voltage of the comparison result, and outputs the same signal to the through or latch converter circuit 310 via a contact "b" of the switch 304b of the AGC selection circuit 304. Although the two comparators 303 and 303A are employed for the reason that the three gain regions are set as shown in FIG. 3 in the present embodiment, the present invention is not limited to this, and it may change the number of the comparators 303 and 303A according to the number of gain regions. Further, the comparators 303 and 303A have hystereses at the leading edge and trailing edge of the RSSI detection voltage as shown in FIG. 3 in order to prevent the fading phenomenon of the radio frequency of the wireless signal and fluctuations in the gain for GCA due to the ripples of the RSSI detection voltage, and the threshold voltages of the comparators 303 and 303A are set to be expressed by the following equations:

(1) Comparator 303:

$$VTHtr = V1 \qquad (1), \text{ and}$$

$$VTHtf = V1 - Vhis \qquad (2),$$

(2) Comparator 303A:

$$VTHtr = V2 \qquad (3), \text{ and}$$

$$VTHtf = V2 - Vhis \qquad (4),$$

where V1>V2.

In this case, as shown in FIG. 3, (a) VTHtr: Threshold voltage at the leading edge,
(b) VTHtf: Threshold voltage at the trailing edge, and
(c) Vhis: Hysteresis voltage.

Referring to FIG. 2, the AGC selection circuit 304a is a switchover circuit for test mode control for delivery inspection. On the basis of an AGC fixation setting signal AGCFIX having, for example, high level (hereinafter referred to as H-level) from the controller 150, the switch 304a is switched to the contact "b", and the switch 304b is switched to the contact "a". At this time, a fixed gain setting signal COMP1FIX for the test mode for delivery inspection from the controller 150 is outputted to the through or latch converter circuit 310 via the contact "b" of the switch 304a, while a fixed gain setting signal COMP2FIX for the test mode for delivery inspection from the controller 150 is outputted to the through or latch converter circuit 310 via the contact "a" of the switch 304b. In this case, the gain setting of the gain control amplifier 103 can be changed compulsorily fixed without depending on the RSSI detection voltage.

The through or latch converter circuit 310 enters a through mode or a latch mode on the basis of a timer output signal from the AGC timer count selection circuit 309. In this case, the through or latch converter circuit 310 enters the through mode in response to the timer output signal having low level (hereinafter referred to as L-level) to output the inputted gain setting signal directly to the AGC control logic circuit 311. The through or latch converter circuit 310 enters the latch mode in response to the timer output signal having H-level to latch and hold the signal levels of the two gain setting signals in built-in latch circuits at the leading edge from L-level to H-level of the timer output signal, and outputs the signal levels to the AGC control logic circuit 311. Further, the AGC control logic circuit 311 is a controller that executes gain setting of the gain control amplifier 103 on the basis of a predetermined logic in accordance with the input signal level as shown in FIG. 3. Although the operation is performed by using the gain of the gain control amplifier 103 as 3-step type AGC circuit in the present embodiment of FIG. 3, the number of steps is not limited to this, and it may be any number of steps or a stepless linear AGC circuit. In the present embodiment, the AGC control logic circuit 311 controls the gain of the gain control amplifier 103 as shown in FIG. 3 by executing logic processing for the inputted gain setting signal so that it enters a high-gain region when the field strength is weak, a medium-gain region when the field strength is medium or a low-gain region when the field strength is strong and outputting the gain setting signal after the logic operation to the gain control amplifier 103.

Figure 8:
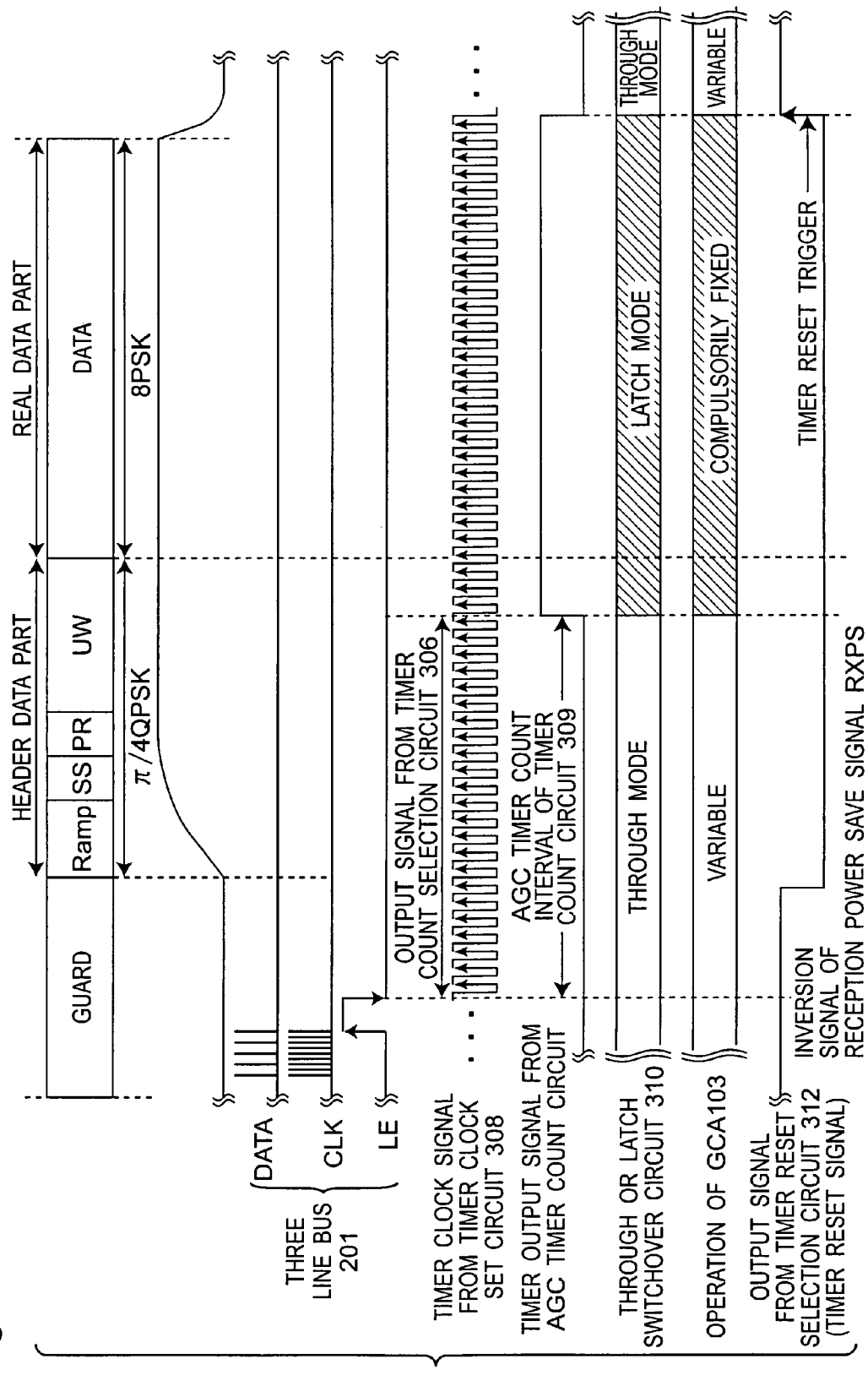
FIG. 8 is a timing chart showing an operation of each part when the load enable signal LE of a three-line bus 201 for channel setting of the PLL circuit 200 is used as a timer start trigger signal, and an inversion signal RXPSB of the reception power save signal RXPS from a controller 150 of the wireless receiver apparatus is used as a timer reset trigger signal in the frequency converter and intermediate frequency circuit 3 of FIG. 2.

FIG. 8 is a timing chart showing an operation of each part when the load enable signal LE of the three-line bus 201 for channel setting of the PLL circuit 200 is used as a timer start trigger signal, and an inversion signal RXPSB of the reception power save signal RXPS from the controller 150 of the wireless receiver apparatus is used as a timer reset trigger signal in the frequency converter and intermediate frequency circuit 3 of FIG. 2. Next, the control processing for compulsorily maintaining the gain of the gain control amplifier 103 at a fixed value, which is the feature of the present embodiment, will be described below.

As described above, the through or latch converter circuit 310 enters the latch mode when the timer output signal from the AGC timer count selection circuit 309 has H-level, and this leads to compulsorily maintaining the gain of the gain control amplifier 103 at a fixed value. On the contrary, the through or latch converter circuit is in the through mode when the timer output signal from the AGC timer count selection circuit 309 has L-level. At the instance when the timer output signal is changed from L-level to H-level, the setting of the gain of the gain control amplifier 103 in the preceding interval is latched and set to the fixed value of the value, and the gain of the gain control amplifier 103 becomes the fixed gain. The fixed gain is maintained until the timer output signal from the AGC timer count selection circuit 309 is changed from H-level to L-level. It is noted that the output logic of the timer output signal and the input logic of the through or latch converter circuit 310 may be both inverted.

Next, a method for generating the timer output signal by the AGC timer count selection circuit 309 will be described below.

The timer output signal counts the count of the timer count set bus signal, which is the output signal from the timer count selection circuit 306, from the leading edge of the timer start signal, which is the output signal from the timer start trigger selection circuit 305, and thereafter changes the timer clock signal from the timer clock set circuit 308 from L-level to H-level, and this leads to setting of the through or latch converter circuit 310 to the latch mode. Further, at the instance when the timer reset signal, which is the output signal from the timer reset selection circuit 312 to the AGC timer count selection circuit 309, is changed from L-level to H-level, the AGC timer count selection circuit 309 changes the timer output signal from H-level to L-level, and this leads to switching the through or latch converter circuit 310 to the through mode.

In the frequency converter and intermediate frequency circuit 3 of the present embodiment, the timing at which the through or latch converter circuit 310 is switched from the through mode to the latch mode is determined depending on the interval of the count corresponding to (clock cycle×timer count) of the timer clock signal from the timer clock set circuit 308 from the leading edge of the timer start signal, which is the output signal from the timer start trigger selection circuit 305. Subsequently, the timing at which the through or latch converter circuit 310 is switched from the latch mode to the through mode is effected when the timer reset signal, which is the output signal from the timer reset selection circuit 312, is changed from L-level to H-level and particularly preferably effected after reception of one slot as shown in FIG. 8.

For the simplification of the timing design of the wireless communication system, a circuit capable of changing the edge timing, the clock cycle and the count mentioned above is herein described.

The timer start trigger selection circuit 305 selects one signal from the load enable signal LE of the three-line bus 201 for channel setting of the PLL circuit 200 and the reception power save signal RXPS on the basis of a selection instruction signal START SELECT, and then, outputs a selected signal as a timer start signal to the AGC timer count selection circuit 309. Although the selection is made from the two signals of the load enable signal LE and the reception power save signal RXPS in the present embodiment, selection from three or more signals is acceptable.

The timer clock set circuit 308 is a frequency divider for dividing a reference clock signal REFCLK and operates to divide the reference clock signal REFCLK by a frequency division number corresponding to frequency division number setting data of the timer clock set bus signal from the timer clock selection circuit 307, and output the same signal obtained through the frequency division as a timer clock signal to the AGC timer count selection circuit 309. Moreover, the timer clock selection circuit 307 selects one signal from a serial timer clock set bus signal and an external timer clock set bus signal on the basis of a selection instruction signal CLK SELECT, and then outputs the same signal as a timer clock set bus signal to the timer clock set circuit 308. The timer clock selection circuit 307 makes it possible to set the clock even by serial data. Likewise, the timer count selection circuit 306 selects one signal from a serial timer count set signal and an external timer count set bus signal on the basis of a selection instruction signal COUNT SELECT, and outputs the same signal as a timer count set bus signal to the AGC timer count selection circuit 309. The timer count selection circuit 306 makes it possible to set the timer count set signal even by serial data. Moreover, it is acceptable to provide such a configuration that the setting of the timer count of the two timer count set bus signals inputted to the timer count selection circuit 306 can be changed to an arbitrary timer count by, for example, the controller 150.

Further, the timer reset selection circuit 312 selects one of the reset signal from the controller 150 and the timer reset trigger signal RXPSB on the basis of an inputted selection instruction signal RESET SELECT, and outputs a selected signal as a timer reset signal to the AGC timer count selection circuit 309.

Next, an AGC timer busy/non-busy signal will be described below.

As described above, in the example of the PHS system, such a configuration that indispensably needs the feature function of the present embodiment is only the slot of which the header data part of the reception wireless signal is modulated by the π/4QPSK modulation and the real data part is modulated by the 8PSK modulation, and the function is not needed for the slot of which the header data part and the real data part are of the π/4QPSK modulation. Furthermore, since it can be determined by the protocol whether the real data part of the next reception slot is modulated by the π/4QPSK modulation or the 8 PSK modulation during wireless communications, it can be selected whether or not the gain of the gain control amplifier 103 is fixed in accordance with the situation if an AGC timer busy/non-busy signal setting bit is provided for the data bit of the three-line bus 201.

FIG. 5 is a graph showing an input signal level to bit error rate (BER) characteristic in the frequency converter and intermediate frequency circuit 3 of FIG. 1. As is apparent from FIG. 5, it can be understood that BER is not deteriorated with either one of the modulation signals.

As described above, according to the present embodiment, since the gain of the gain control amplifier 103 is compulsorily maintained to the fixed value in the specified interval of the unit word (UW) part of the received wireless signal, the phase change of the reception signal due to the gain change in the real data part disappears, and the deterioration point of the bit error rate (BER) is eliminated, and this leads to keeping the satisfactory communication quality.

INDUSTRIAL APPLICABILITY

As described above, according to the wireless receiver apparatus of the present invention, the wireless receiver apparatus includes a gain control amplifier for controlling the gain of the reception signal, and the maintaining device for compulsorily maintaining the gain of the gain control amplifier to the predetermined fixed value only in a predetermined specified interval, and the maintaining device includes the latch circuit that maintains the gain set value immediately before the specified interval. In this case, the start timing of the specified interval is determined by the edge of the predetermined timer start signal, the duration of the specified interval is determined on the basis of the count of the predetermined timer clock signal and the count of the predetermined timer count set bus signal, and the end timing of the specified interval is determined on the basis of the edge of the predetermined timer reset signal. Therefore, as shown in FIG. 5, the phase change of the reception signal due to the gain change in the real data part of the received wireless signal disappears, and the deterioration point of the bit error rate (BER) is eliminated, and this leads to keeping the satisfactory communication quality.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A wireless receiver apparatus comprising:
   a gain control amplifier for controlling a gain of a reception signal, and
   a maintaining device for compulsorily maintaining the gain of the gain control amplifier at a predetermined fixed value only in a predetermined specified interval,
   wherein a start timing of the specified interval is determined by an edge of a predetermined timer start signal, and
   wherein a duration of the specified interval is determined on the basis of a count of a predetermined timer clock signal and a count of a predetermined timer count set bus signal.

2. The wireless receiver apparatus as claimed in claim 1, wherein the maintaining device comprises a latch circuit for maintaining a gain set value immediately prior to the specified interval.

3. The wireless receiver apparatus as claimed in claim 1, wherein an end timing of the specified interval is determined on the basis of an edge of a predetermined timer reset signal.

4. The wireless receiver apparatus as claimed in claim 3, further comprising a second selection circuit for selecting one second control signal from a plurality of predetermined second control signals, and outputting a selected signal as the timer reset signal.

5. The wireless receiver apparatus as claimed in claim 1, further comprising a setting device for setting whether or not to operate the maintaining device on the basis of a predetermined AGC timer busy/non-busy signal.

6. The wireless receiver apparatus as claimed in claim 5, wherein the AGC timer busy/non-busy signal is transmitted on a predetermined three-line bus for setting a predetermined reception channel.

7. The wireless receiver apparatus as claimed in claim 1, further comprising a first selection circuit for selecting one first control signal from a plurality of predetermined first control signals, and outputting a selected signal as the timer start signal.

8. The wireless receiver apparatus as claimed in claim 1, further comprising a frequency divider circuit for dividing a frequency of a predetermined reference clock signal by an inputted frequency division number, and outputting a frequency-divided signal as the timer clock signal.

9. The wireless receiver apparatus as claimed in claim 8, further comprising a fourth selection circuit for selecting one signal from a serial timer clock set bus signal transmitted on a three-line bus for setting a predetermined reception channel and an external timer clock set bus signal, and outputting a selected signal as a signal representing the frequency division number.

10. The wireless receiver apparatus as claimed in claim 1, further comprising a third selection circuit for selecting one signal from a serial timer count set bus signal transmitted on a three-line bus for setting a predetermined reception channel and an external timer count set bus signal, and outputting a selected signal as the timer count set bus signal.

11. The wireless receiver apparatus as claimed in claim 10, further comprising a further setting device for setting timer counts of the serial timer count set bus signal and the external timer count set bus signal to arbitrary timer counts, respectively.

12. The wireless receiver apparatus as claimed in claim 1, wherein the start timing of the specified interval is set for an interval for which a unique word (UW) of a received wireless signal is received.

13. The wireless receiver apparatus as claimed in claim 1, wherein an end timing of the specified interval is set after transfer of reception data in one slot of a received wireless signal is completed.

14. A semiconductor integrated circuit which is formed by integrating a circuit of a wireless receiver apparatus, said integrated circuit comprising:
 a gain control amplifier for controlling a gain of a reception signal, and
 a maintaining device for compulsorily maintaining the gain of the gain control amplifier at a predetermined fixed value only in a predetermined specified interval,
 wherein a start timing of the specified interval is determined by an edge of a predetermined timer start signal, and
 wherein a duration of the specified interval is determined on the basis of a count of a predetermined timer clock signal and a count of a predetermined timer count set bus signal.

* * * * *